United States Patent
Wu

(10) Patent No.: US 9,910,079 B2
(45) Date of Patent: Mar. 6, 2018

(54) GROUNDING RESISTANCE MEASUREMENT APPARATUS AND METHOD OF OPERATING THE SAME

(71) Applicant: DELTA ELECTRONICS, INC., Taoyuan County (TW)

(72) Inventor: Tsung-Yuan Wu, Taoyuan County (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 217 days.

(21) Appl. No.: 14/920,138

(22) Filed: Oct. 22, 2015

(65) Prior Publication Data

US 2016/0139193 A1    May 19, 2016

(30) Foreign Application Priority Data

Nov. 18, 2014 (TW) .............................. 103139913 A

(51) Int. Cl.
 *G01R 27/18* (2006.01)
 *G01R 31/02* (2006.01)

(52) U.S. Cl.
 CPC ........... *G01R 31/025* (2013.01); *G01R 27/18* (2013.01)

(58) Field of Classification Search
 CPC .............................. G01R 27/18; G01R 31/025
 See application file for complete search history.

(56) References Cited

U.S. PATENT DOCUMENTS

| 5,150,057 A | 9/1992 | Suptitz et al. |
| 6,281,664 B1 * | 8/2001 | Nakamura ............... H02P 9/307 322/20 |
| 8,390,298 B2 | 3/2013 | Kereit et al. |

(Continued)

FOREIGN PATENT DOCUMENTS

| CN | 101682185 | 3/2014 |
| JP | S55076960 | 6/1980 |
| JP | H03-185367 | 8/1991 |

(Continued)

OTHER PUBLICATIONS

Office Action dated Nov. 25, 2015 from corresponding application No. TW 103139913.

(Continued)

*Primary Examiner* — Jermele M Hollington
*Assistant Examiner* — Feba Pothen
(74) *Attorney, Agent, or Firm* — Hauptman Ham, LLP

(57) ABSTRACT

A grounding resistance measurement apparatus measures a grounding resistance at an AC power terminal, and is electrically connected to an equipment input terminal which provides an AC power source. The grounding resistance measurement apparatus includes a DC power generation circuit and a DC voltage detection circuit. The DC power generation circuit receives the AC power source at the equipment input terminal and converts the AC power source into a DC power source. The DC power source is provided to produce a DC resistance voltage across the grounding resistance. A voltage difference between the equipment input terminal and an equipment grounding point is equal to the DC resistance voltage so that the grounding resistance is calculated according to the zero DC component in an AC power loop.

24 Claims, 8 Drawing Sheets

(56) References Cited

U.S. PATENT DOCUMENTS

2013/0322133 A1* 12/2013 Li .................. G01R 31/025
                                              363/37
2015/0022219 A1* 1/2015 Kawamura ......... G01R 31/024
                                              324/551

FOREIGN PATENT DOCUMENTS

JP      2009-210438     9/2009
TW        20134421     11/2013

OTHER PUBLICATIONS

European Search Report dated Feb. 25, 2016 from corresponding application No. EP 15191498.3.
Office Action dated Sep. 6, 2016 from corresponding application No. JP 2015-214201.

* cited by examiner

GROUNDING RESISTANCE MEASUREMENT APPARATUS AND METHOD OF OPERATING THE SAME

BACKGROUND OF THE INVENTION

1. Technical Field

The present disclosure relates generally to a grounding resistance measurement apparatus and a method of operating the same, and more particularly to a grounding resistance measurement apparatus and a method of operating the same for measuring a grounding resistance at an AC power terminal.

2. Description of Related Art

The UL 2231-1 is a standard for personal protection systems for electric vehicle (EV) supply circuits. The general requirements cover devices and systems intended for used in accordance with the National Electrical Code (NEC) to reduce the risk of electric shock to the user from accessible parts, in grounded or isolated circuits for charging electric vehicles.

In addition, the PE protecting wire is used to connect the all exposed conductive parts of the electrical equipment to provide the equal potential connection system for applications of the distribution system. Because the magnitude of the fault current caused by the isolation destruction is absolutely related to the magnitude of the grounding resistance, the good grounding protection can provide the electrical safety. Accordingly, it is important and beneficial for the grounding fault detection and the grounding protection to accurately detect the condition of the grounding resistance at the AC power terminal.

Reference is made to FIG. 1A, FIG. 1B, and FIG. 1C which are circuit diagrams of conventional grounding resistance detection circuits. The optical coupler Op as shown in FIG. 1A or the transistor switch Q1 and the resistors R1, R2 as shown in FIG. 1B are used to detect and measure the grounding resistance at the AC power terminal. More specifically, a square-wave signal with equal duty cycle would be produced at an output terminal Pa when the grounding resistance Rg is short circuit, as shown in FIG. 2A. On the contrary, the duty cycle of the square-wave signal is varied when the grounding resistance Rg is in a high-impedance state (such as MΩ). Therefore, the condition of the grounding resistance Rg can be detected according to the width of duty cycle of the square-wave signal.

In addition, as shown in FIG. 1C, the waveform of a signal, which is not a square-wave signal as shown in FIG. 2B, produced at the output terminal Pa can be acquired to detect whether the grounding resistance Rg is varied or not. However, the conventional grounding resistance detection circuits exist following disadvantages:

1. The grounding resistance Rg cannot be accurately detected. Because the waveform of the signal produced at the output terminal Pa is detected to judge the condition of the grounding resistance Rg at the AC power terminal, the square-wave signal with equal duty cycle can be judged that the grounding resistance Rg is short circuit. However, the condition of the grounding resistance Rg cannot be accurately detected according to the irregular waveform of the signal produced at the output terminal Pa;

2. The small-scale grounding resistance Rg cannot be detected. The conventional grounding resistance detection circuits are usually used to detect the grounding resistance Rg with at least 50KΩ or 200KΩ. Therefore, the resistance detection results would be extremely wrong once the impedance value of the grounding resistance Rg is lower; and 3. The harm of the human body and the damage of the electrical equipment could occur because the leakage current flowing back to the grounding wire is large.

Accordingly, it is desirable to provide a grounding resistance measurement apparatus and a method of operating the same to accurately calculate a grounding resistance between an equipment grounding point and power grounding point under the protections of the human body and the electrical equipment.

SUMMARY OF THE INVENTION

An object of the present disclosure is to provide a grounding resistance measurement apparatus to solve the above-mentioned problems. Accordingly, the grounding resistance measurement apparatus is electrically connected between an equipment input terminal providing an AC power source and an equipment grounding point to measure a grounding resistance at an AC power terminal. The grounding resistance measurement apparatus includes a DC power generation circuit and a DC voltage detection circuit. The DC power generation circuit is electrically connected to the equipment input terminal and the equipment grounding point, and receives the AC power source and converts the AC power source into a DC power source. The DC power source produces a DC resistance voltage across the grounding resistance. The DC voltage detection circuit is electrically connected to the equipment input terminal and the equipment grounding point, and measures a DC voltage difference between the equipment input terminal and the equipment grounding point. The grounding resistance is calculated because the DC voltage difference is equal to the DC resistance voltage across the grounding resistance according to a characteristic of the zero DC component in an AC power loop.

Another object of the present disclosure is to provide a method of operating a grounding resistance measurement apparatus to solve the above-mentioned problems. Accordingly, the grounding resistance measurement apparatus is electrically connected between an equipment input terminal providing an AC power source and an equipment grounding point to measure a grounding resistance at an AC power terminal. The method includes (a) providing a DC power generation circuit electrically connected to the equipment input terminal and the equipment grounding point to receive the AC power source; (b) converting the AC power source into a DC power source, and the DC power source is configured to produce a DC resistance voltage across the grounding resistance; (c) providing a DC voltage detection circuit to measure a DC voltage difference between the equipment input terminal and the equipment grounding point; and (d) calculating the grounding resistance because the DC voltage difference is equal to the DC resistance voltage across the grounding resistance according to a characteristic of the zero DC component in an AC power loop.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION

Figure 1A:
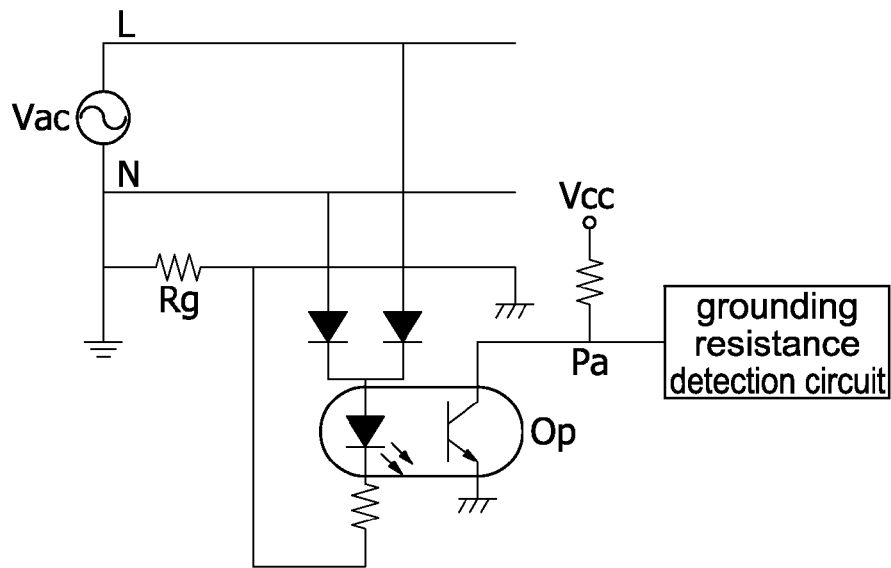
FIG. 1A is a circuit diagram of a conventional grounding resistance detection circuit.
Figure 1B:
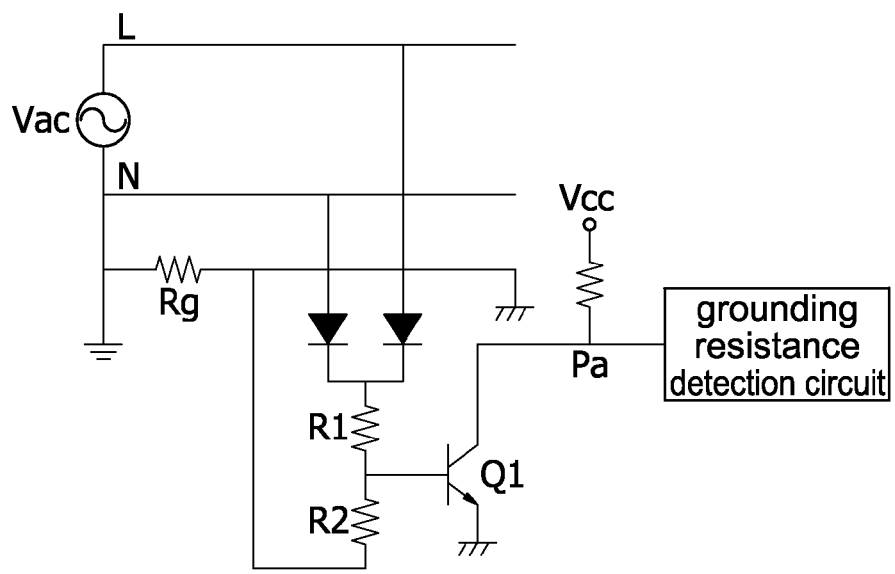
FIG. 1B is a circuit diagram of another conventional grounding resistance detection circuit.
Figure 1C:
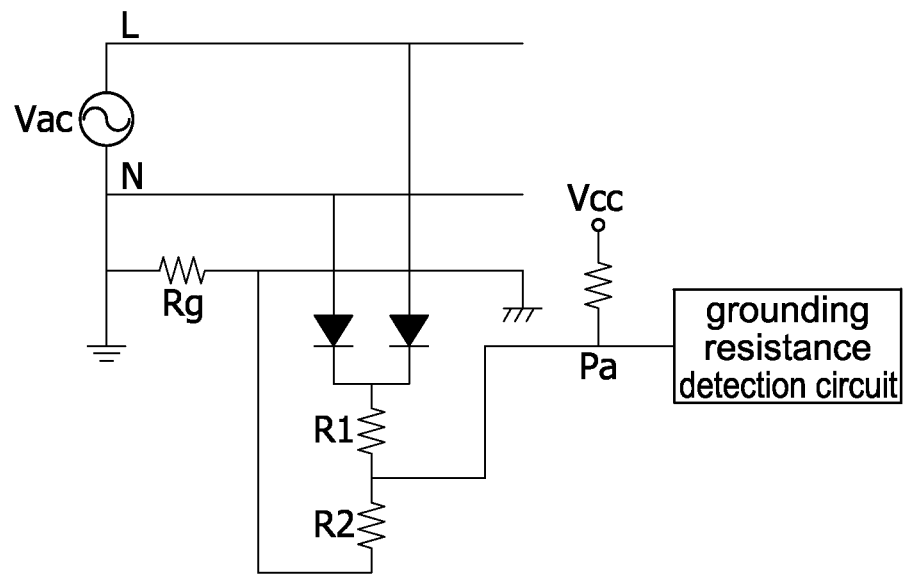
FIG. 1C is a circuit diagram of further another conventional grounding resistance detection circuit.
Figure 2A:
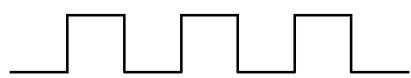
FIG. 2A is a waveform of an output signal of the grounding resistance detection circuit in FIG. 1A and FIG. 1B.
Figure 2B:
FIG. 2B is a waveform of an output signal of the grounding resistance detection circuit in FIG. 1C.

Reference will now be made to the drawing figures to describe the present disclosure in detail.

Figure 3:
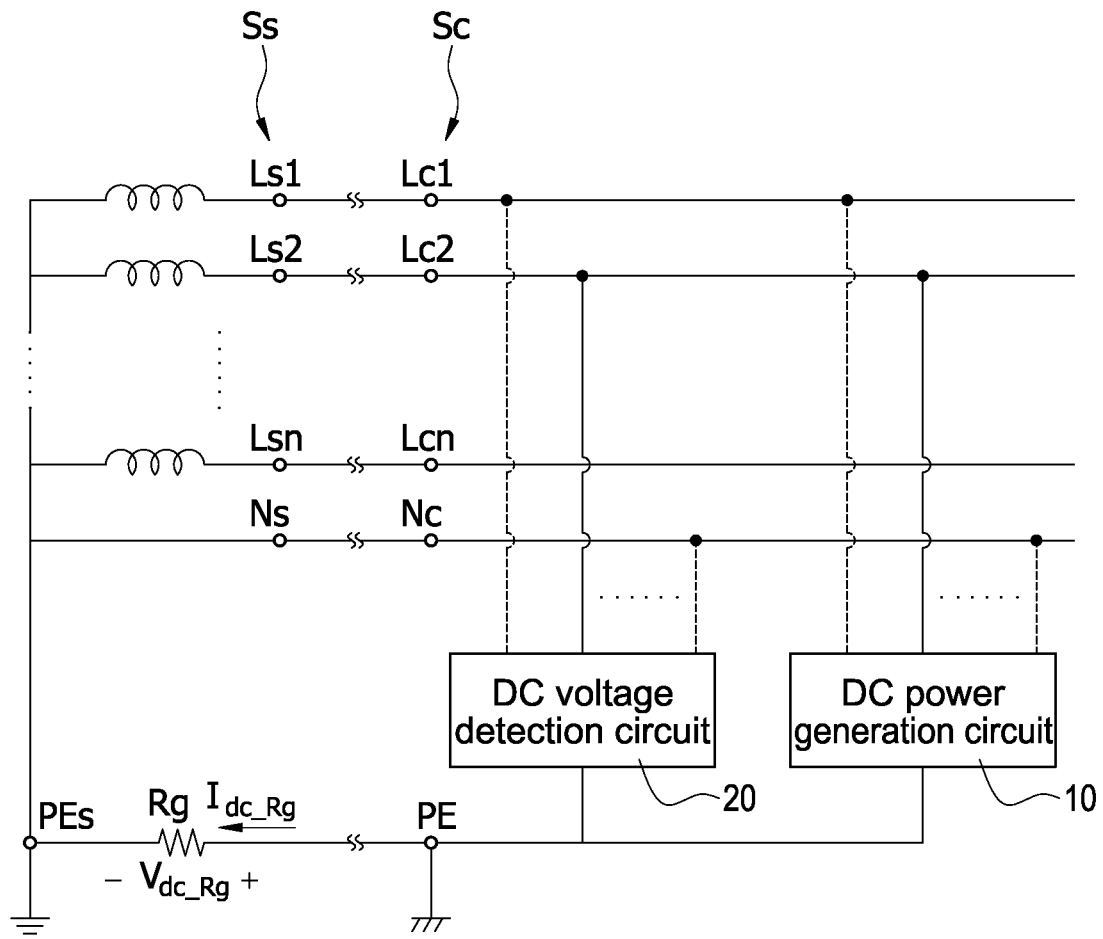
FIG. 3 is a circuit block diagram of a grounding resistance measurement apparatus according to the present disclosure.

Reference is made to FIG. 3 which is a circuit block diagram of a grounding resistance measurement apparatus according to the present disclosure. The grounding resistance measurement apparatus is used to measure a grounding resistance Rg between an equipment grounding point PE and a power grounding point PEs. The grounding resistance measurement apparatus is electrically connected to an equipment input terminal Sc with the corresponding phases to the AC power terminal Ss. In other words, the AC power terminal Ss has three live wires Ls1-Ls3 and a neutral wire Ns when the AC power source is a three-phase four-wire system, and the equipment input terminal Sc also provides three live wires Lc1-Lc3 and a neutral wire Nc. Similarly, the AC power terminal Ss has three live wires Ls1-Ls3 when the AC power source is a three-phase three-wire system, and the equipment input terminal Sc also provides three live wires Lc1-Lc3. Especially, the grounding resistance measurement apparatus can be applied to a multi-phase power system.

In general, the AC power terminal Ss and the equipment input terminal Sc are separated by great distances, at least hundreds of meters or even more than tens of kilometers. Therefore, the symbol "≈" expresses that the AC power terminal Ss and the equipment input terminal Sc are separated by great distances. Similarly, the symbol "≈" expresses that the equipment grounding point PE and the power grounding point PEs are separated by great distances.

The grounding resistance measurement apparatus mainly includes a DC power generation circuit 10 and a DC voltage detection circuit 20. The DC power generation circuit 10 is electrically connected between the equipment input terminal Sc and the equipment grounding point PE. More specifically, one side of the DC power generation circuit 10 is electrically connected to at least one phase of the equipment input terminal Sc and the other side thereof is electrically connected to the equipment grounding point PE. Take FIG. 3 for example, one side of the DC power generation circuit 10 is electrically connected to the second live wire Lc2 and the other side thereof is electrically connected to the equipment grounding point PE. Note that, other optional connections between the DC power generation circuit 10 and the equipment input terminal Sc are illustrated by dotted lines. The DC voltage detection circuit 20 is electrically connected between the equipment input terminal Sc and the equipment grounding point PE. In other words, one side of the DC voltage detection circuit 20 is electrically connected to at least one phase of the equipment input terminal Sc and the other side thereof is electrically connected to the equipment grounding point PE. Take FIG. 3 for example, one side of the DC voltage detection circuit 20 is electrically connected to the second live wire Lc2 and the other side thereof is electrically connected to the equipment grounding point PE. In particular, one side of the DC power generation circuit 10 and one side of the DC voltage detection circuit 20 can be electrically connected to any one phase of the live wires Lc1-Lc3 or the neutral wire Nc.

The DC power generation circuit 10 can be a DC voltage generation circuit or a DC current generation circuit. The generated DC power source provides a DC resistance voltage $V_{dc\_Rg}$ across the grounding resistance Rg and a DC resistance current $I_{dc\_Rg}$ flowing through the grounding resistance Rg. If the DC power source is a DC current source, the DC resistance current $I_{dc\_Rg}$ flowing through the grounding resistance Rg will be known. In addition, the DC resistance voltage $V_{dc\_Rg}$ is equal to a DC voltage difference between the equipment grounding point PE and one of the live wires Lc1-Lc3 of the equipment input terminal Sc or the neutral wire Nc because the characteristic of the zero DC component in the AC power loop. That is, the DC voltage difference can be measured at the equipment input terminal Sc to acquire the DC resistance voltage $V_{dc\_Rg}$ across the grounding resistance Rg without directly measuring the DC voltage difference between the power grounding point PEs and the equipment grounding point PE. Accordingly, the grounding resistance Rg between the power grounding point PEs and the equipment grounding point PE can be acquired by calculating a ratio between the DC resistance voltage $V_{dc\_Rg}$ and the DC resistance current $I_{dc\_Rg}$. In addition, the grounding resistance Rg can be calculated by a voltage-dividing theory if the DC power generation circuit 10 generates a DC voltage source.

In this embodiment, the DC current generation circuit is exemplified as the DC power generation circuit 10 to further demonstrate the present invention. The DC power generation circuit 10 generates a DC current Idc and the DC current Idc flowing through the grounding resistance Rg is also referred to as the DC resistance current $I_{dc\_Rg}$, and the DC resistance voltage $V_{dc\_Rg}$ is produced by the DC resistance current $I_{dc\_Rg}$ across the grounding resistance Rg.

However, this example is for demonstration and not for limitation of the present disclosure. In other words, the input side and the output side of the DC power generation circuit 10 can be also electrically connected to any two of the neutral wire Nc and the live wires Lc1-Lc3. Also, the output side of the DC power generation circuit 10 is connected to the equipment grounding point PE. Accordingly, the generated DC voltage or DC current can be provided to accurately calculate the grounding resistance Rg between the power grounding point PEs and the equipment grounding point PE. The detailed operation of the DC power generation circuit 10 and the DC voltage detection circuit 20 will be described hereinafter as follows.

Figure 4A:
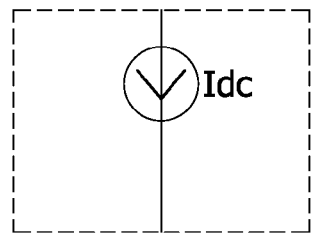
FIG. 4A is a circuit diagram of a DC power generation circuit to be a DC current source according to the present disclosure.

In the present disclosure, the DC power generation circuit 10 can be a DC current source or a DC voltage source. Reference is made to FIG. 4A which is a circuit diagram of a DC power generation circuit to be a DC current source according to the present disclosure. According to the above-mentioned descriptions, the DC power generation circuit 10 is electrically connected between the equipment input terminal Sc and the equipment grounding point PE to directly receive the AC voltage at the equipment input terminal Sc. In particular, the DC power generation circuit 10 is used to convert the AC voltage to output a DC current Idc.

Figure 4B:
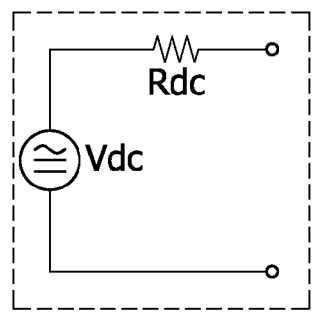
FIG. 4B is a circuit diagram of the DC power generation circuit to be a DC voltage source according to the present disclosure.

In addition, reference is made to FIG. 4B which is a circuit diagram of the DC power generation circuit to be a DC voltage source according to the present disclosure. As mentioned above, the DC power generation circuit 10 is used to directly receive the AC voltage at the equipment input terminal Sc and convert the AC voltage to output a DC voltage Vdc. Especially, the DC voltage Vdc is not limited to be a pure DC voltage without AC ripple components, but also to be a rectified and/or filtered DC voltage.

Figures 4C, 4D:
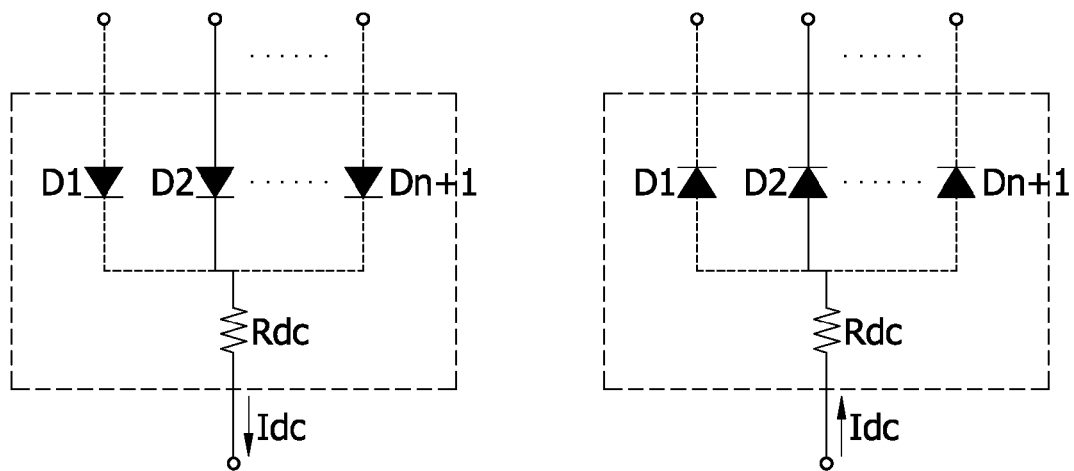
FIG. 4C is a circuit diagram of the DC power generation circuit according to a first embodiment of the present disclosure.
FIG. 4D is a circuit diagram of the DC power generation circuit according to a second embodiment of the present disclosure.

Reference is made to FIG. 4C which is a circuit diagram of the DC power generation circuit according to a first embodiment of the present disclosure. The DC power generation circuit 10 includes a plurality of diodes D1-Dn+1 and a resistor Rdc. The diodes D1-Dn+1 are correspondingly electrically connected to the live wires Lc1-Lc3 and the neutral wire Nc at the equipment input terminal Sc. More specifically, the anodes of the diodes D1-Dn+1 are correspondingly electrically connected to the live wires Lc1-Lc3 and the neutral wire Nc. One terminal of the resistor Rdc is electrically connected to the cathodes of the diodes D1-Dn+1, and the other terminal of the resistor Rdc is connected to the equipment grounding point PE. Under this circuit structure, the AC voltage at the equipment input terminal Sc is rectified into a DC voltage by the diodes D1-Dn+1. Accordingly, the DC power generation circuit can be implemented by the diodes D1-Dn+1 and the resistor Rdc. Especially, only one diode can be used to connect to one phase of the equipment input terminal Sc to generate the DC power source. In this embodiment, the second diode D2 is correspondingly electrically connected to the live wire Lc2 shown by solid lines in FIG. 4C. On the contrary, the remaining diodes shown by dotted lines can be optionally connected to other live wires and the neutral wire Nc.

Reference is made to FIG. 4D which is a circuit diagram of the DC power generation circuit according to a second embodiment of the present disclosure. The major difference between the second embodiment in FIG. 4D and the first embodiment in FIG. 4C is that the cathodes of the diodes D1-Dn+1 are correspondingly electrically connected to the live wires Lc1-Lc3 and the neutral wire Nc at the equipment input terminal Sc. One terminal of the resistor Rdc is electrically connected to the anodes of the diodes D1-Dn+1, and the other terminal of the resistor Rdc is connected to the equipment grounding point PE. Under this circuit structure, the AC voltage at the equipment input terminal Sc is rectified into a DC voltage by the diodes D1-Dn+1. Because the diodes D1-Dn+1 are inversely connected to the live wires Lc1-Lc3 and the neutral wire Nc, the direction of the DC current Idc in FIG. 4D is opposite to that of the DC current Idc in FIG. 4C. In particular, the diodes D1-Dn+1 in FIG. 4C can be used to rectify the positive half cycle of the AC voltage and the diodes D1-Dn+1 in FIG. 4D can be used to rectify the negative half cycle of the AC voltage. Similarly, the DC power generation circuit can be implemented by the diodes D1-Dn+1 and the resistor Rdc.

Especially, the DC power generation circuit 10 can be implemented by the circuit that can convert the AC voltage into the DC current or the DC voltage, that is, the two embodiments as shown in FIG. 4C and FIG. 4D are not limited. For example, the current mirror circuit or other self-design circuits can be used to implement the DC power generation circuit 10.

Figure 5:
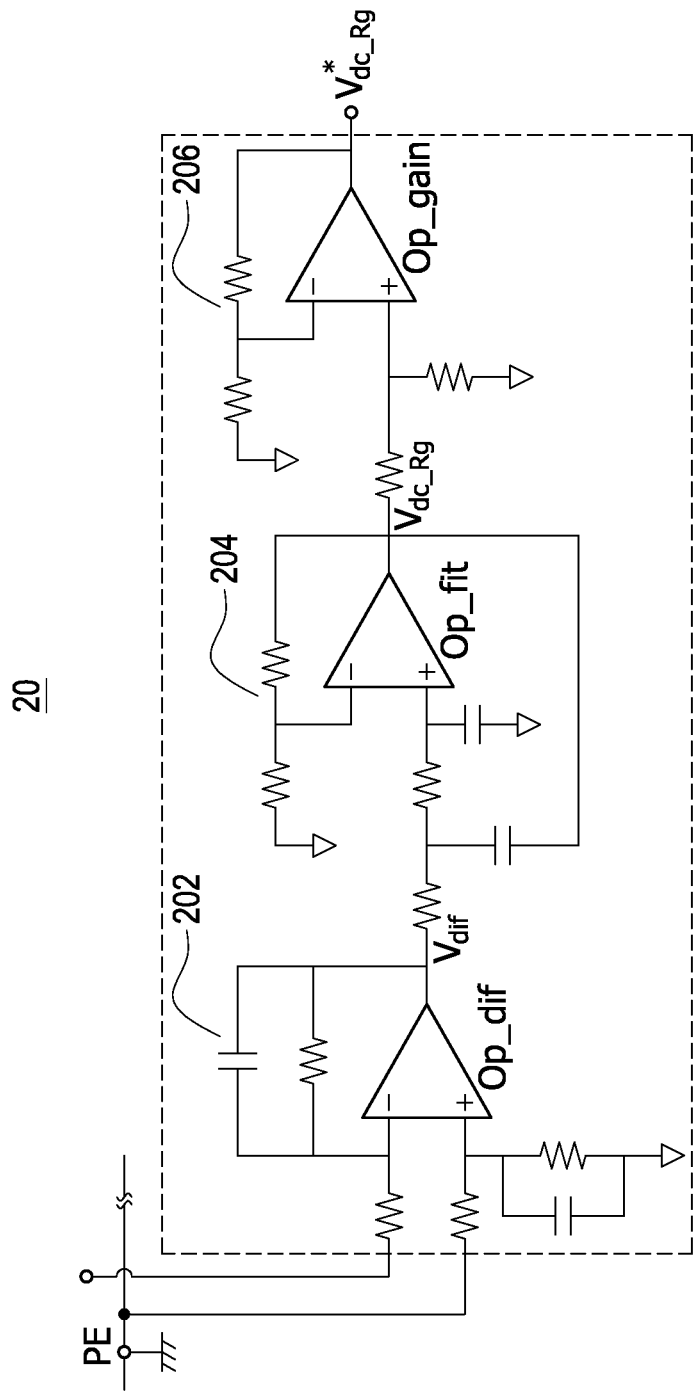
FIG. 5 is a circuit diagram of a DC voltage detection circuit according to a preferred embodiment of the present disclosure.

Reference is made to FIG. 5 which is a circuit diagram of a DC voltage detection circuit according to a preferred embodiment of the present disclosure. The DC voltage detection circuit 20 mainly includes a differential amplifier circuit 202 and a low-pass filter circuit 204. The differential amplifier circuit 202 is composed of a differential operational amplifier Op_dif, a plurality of resistors, and a plurality of capacitors. More specifically, the differential operational amplifier Op_dif has an inverting input terminal and a non-inverting input terminal. The non-inverting input terminal is electrically connected to the equipment grounding point PE, and the inverting input terminal is electrically connected to any one of the live wires Lc1-Lc3 or the neutral wire Nc at the equipment input terminal Sc. The differential amplifier circuit 202 is used to capture a voltage difference between the equipment grounding point PE and one of the live wires Lc1-Lc3 or the neutral wire Nc, and output a differential voltage Vdif. The low-pass filter circuit 204 is electrically connected to the differential amplifier circuit 202. The low-pass filter circuit 204 is composed of an operational amplifier Op_fit, a plurality of resistors, and a plurality of capacitors. More specifically, the operational amplifier Op_fit has an inverting input terminal and a non-inverting input terminal. The non-inverting input terminal is electrically connected to the differential operational amplifier Op_dif to receive the differential voltage Vdif. The operational amplifier Op_fit is used to capture DC components of the differential voltage Vdif, that is, the voltage outputted from the operational amplifier Op_fit is the DC resistance voltage $V_{dc\_Rg}$.

Accordingly, the DC resistance voltage $V_{dc\_Rg}$ can be outputted to a microprocessor 30 to accurately calculate the grounding resistance Rg.

In addition, the DC voltage detection circuit 20 further includes a gain adjustment circuit 206, and the gain adjustment circuit 206 is electrically connected between the low-pass filter circuit 204 and the microprocessor 30. The gain adjustment circuit 206 is composed of an operational amplifier Op_gain and a plurality of resistors. More specifically, the operational amplifier Op_gain has an inverting input terminal and a non-inverting input terminal. The non-inverting input terminal is electrically connected to the operational amplifier Op_fit to receive the DC resistance voltage $V_{dc\_Rg}$. The gain adjustment circuit 206 is used to adjust the DC resistance voltage $V_{dc\_Rg}$ into an adjusted DC resistance voltage $V^*_{dc\_Rg}$ so that the scale of the adjusted DC resistance voltage V*$_{dc\_Rg}$ is suitable for the microprocessor 30 in the signal magnitude and the signal resolution.

Figure 6:
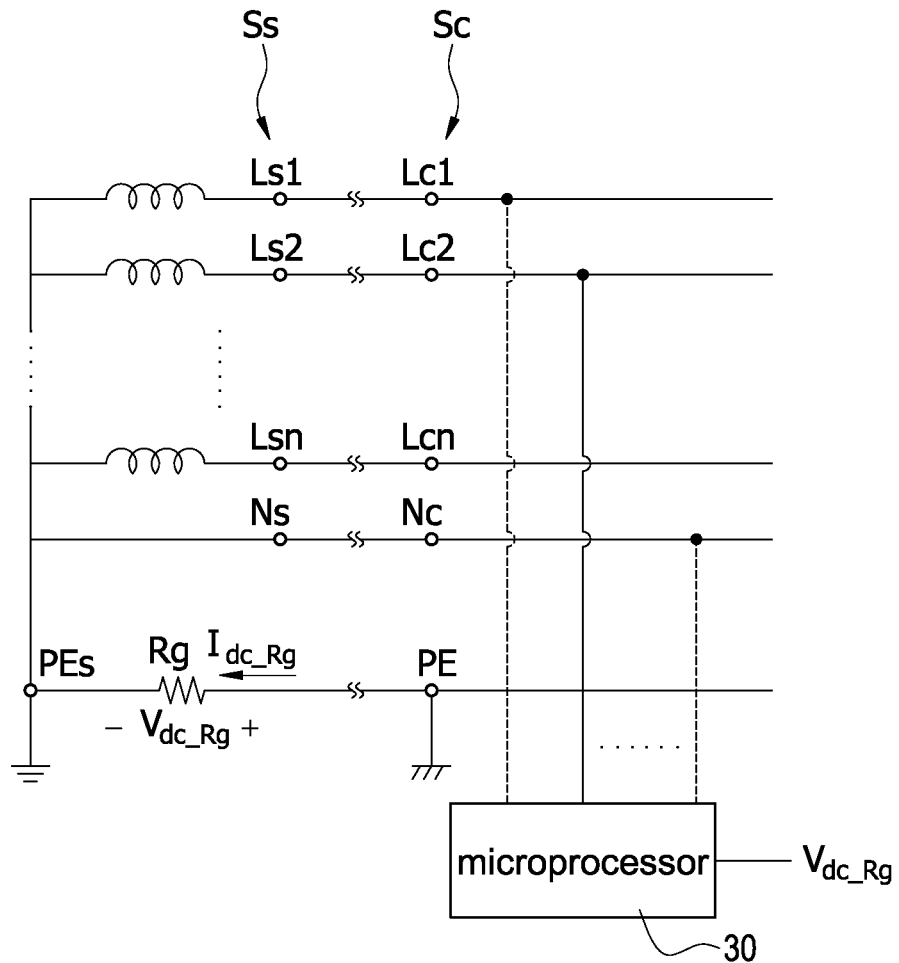
FIG. 6 is a circuit block diagram of applying a microprocessor to the grounding resistance measurement apparatus according to the present disclosure.

Reference is made to FIG. 6 which is a circuit block diagram of applying a microprocessor to the grounding resistance measurement apparatus according to the present disclosure. Because the AC power source is varied, the microprocessor 30 receives the voltage information of the equipment input terminal Sc to correspondingly calculate the grounding resistance Rg according to the varied conditions of the AC power source so that the calculated grounding resistance Rg is unaffected by the varied conditions.

Figure 7:
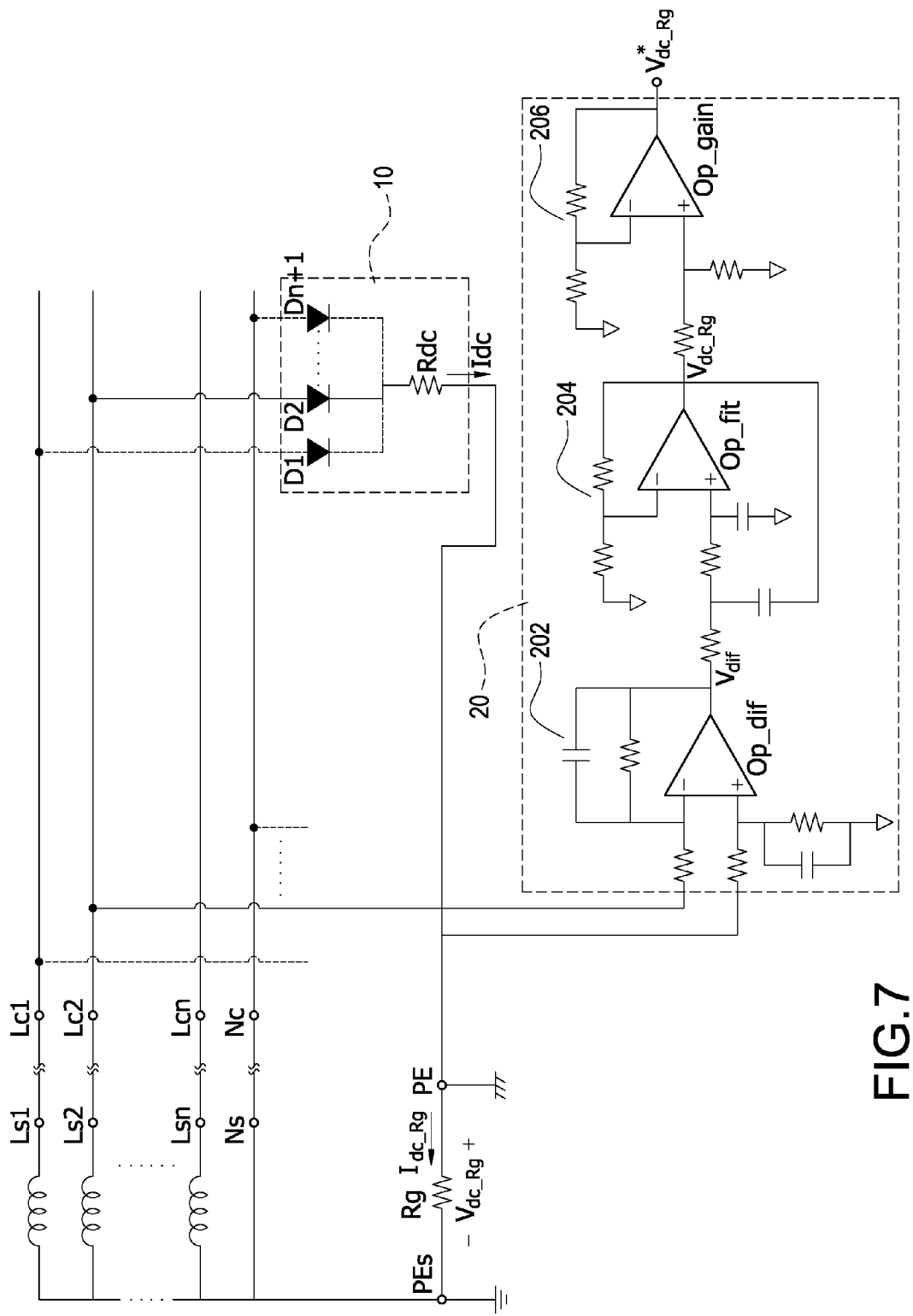
FIG. 7 is a circuit diagram of the detailed grounding resistance measurement apparatus applied to an AC power terminal according to the present disclosure.

Reference is made to FIG. 7 which is a circuit diagram of the detailed grounding resistance measurement apparatus applied to an AC power terminal according to the present disclosure. FIG. 7 illustrates a preferred embodiment of combining the DC power generation circuit 10 in FIG. 4C and the DC voltage detection circuit 20 in FIG. 5 into FIG. 3. However, the above-mentioned circuit combination is only exemplified but is not intended to limit the scope of the disclosure. Especially, the non-inverting input terminal of the differential amplifier circuit 202 of the DC voltage detection circuit 20 is connected to the equipment grounding point PE, and the inverting input terminal of the differential amplifier circuit 202 can be connected to any one of the live wires Lc1-Lc3 or the neutral wire Nc. In FIG. 7, the inverting input terminal of the differential amplifier circuit 202 connecting to the second live wire Lc2 is exemplified for further demonstration. In other words, the differential amplifier circuit 202 captures the voltage difference between the equipment grounding point PE and one of the live wires Lc1-Lc3 or the neutral wire Nc, and output the differential voltage Vdif. Also, the differential voltage Vdif is processed by the DC voltage detection circuit 20 to acquire the DC resistance voltage V$_{dc\_Rg}$ or the adjusted DC resistance voltage V*$_{dc\_Rg}$.

The main technical spirit of the grounding resistance measurement apparatus is that the DC power generation circuit 10 is provided to convert the AC voltage at the equipment input terminal Sc into the DC voltage so that the DC resistance voltage V$_{dc\_Rg}$ across the grounding resistance Rg. Further, a DC voltage difference measured between the equipment input terminal Sc and the equipment grounding point PE is equal to the DC resistance voltage V$_{dc\_Rg}$ according to the characteristic of the zero DC component in the AC power source. Accordingly, the grounding resistance Rg between the equipment grounding point PE and the power grounding point PEs can be accurately calculated by the microprocessor 30.

Figure 8:
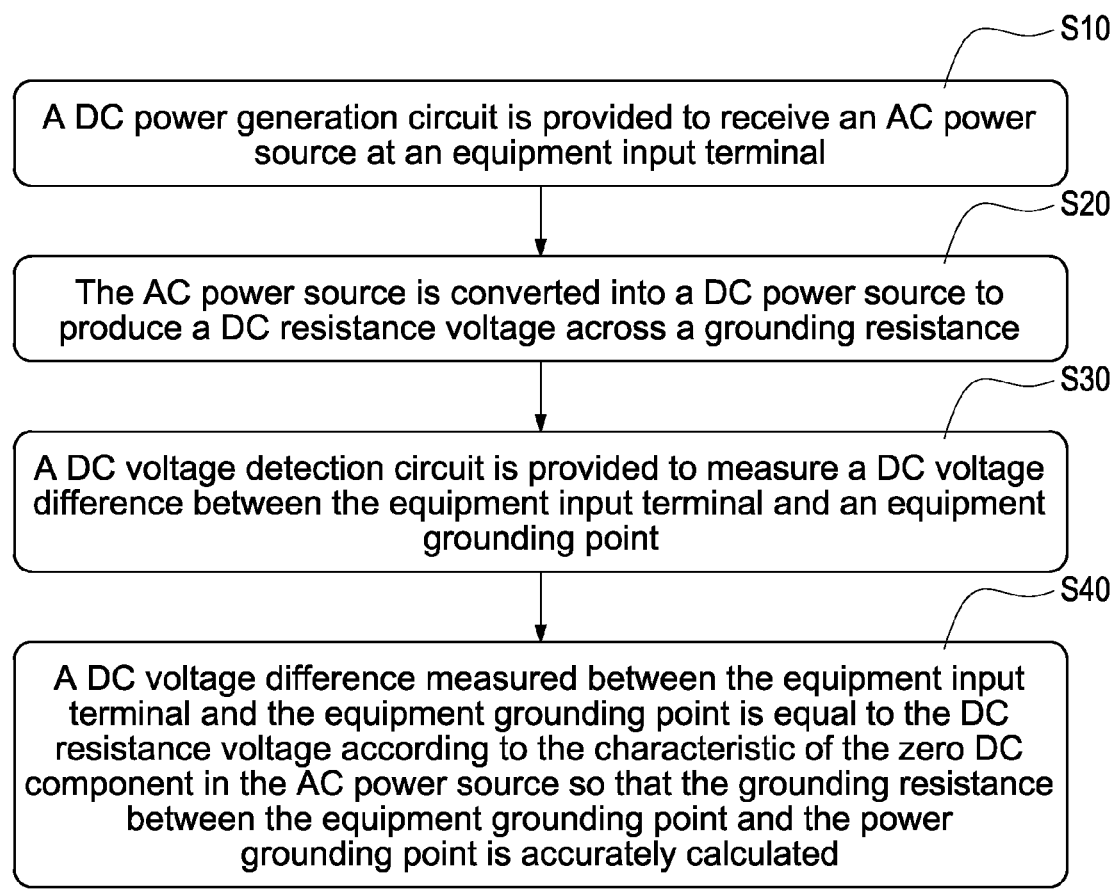
FIG. 8 is a flowchart of a method of operating a grounding resistance measurement apparatus according to the present disclosure.

Reference is made to FIG. 8 which is a flowchart of a method of operating a grounding resistance measurement apparatus according to the present disclosure. The grounding resistance measurement apparatus is used to measure a grounding resistance at an AC power terminal, and is electrically connected between an equipment input terminal with the corresponding phases to the AC power terminal and an equipment grounding point. The method includes steps as follows. First, a DC power generation circuit is provided. The DC power generation circuit is electrically connected to the equipment input terminal and the equipment grounding point, and receives an AC power source at the equipment input terminal (S10). In particular, the AC power terminal has three live wires and a neutral wire when the AC power source is a three-phase four-wire system, and the equipment input terminal also provides three live wires and a neutral wire. Similarly, the AC power terminal has three live wires when the AC power source is a three-phase three-wire system, and the equipment input terminal also provides three live wires.

Afterward, the AC power source is converted into a DC power source, and the DC power source is provided to produce a DC resistance voltage across the grounding resistance (S20). In the present disclosure, the DC power generation circuit can be a DC current source or a DC voltage source. The DC power generation circuit is electrically connected between the equipment input terminal and the equipment grounding point to directly receive the AC voltage at the equipment input terminal. In particular, the DC power generation circuit is used to convert the AC voltage to output a DC current. In addition, the DC power generation circuit can be also used to directly receive the AC voltage at the equipment input terminal and convert the AC voltage to output a DC voltage. Especially, the DC voltage is not limited to be a pure DC voltage without AC ripple components, but also to be a rectified and/or filtered DC voltage.

A DC voltage detection circuit is provided to measure a DC voltage difference between the equipment input terminal and the equipment grounding point (S30). The DC voltage detection circuit mainly includes a differential amplifier circuit and a low-pass filter circuit. The differential amplifier circuit is composed of a differential operational amplifier, a plurality of resistors, and a plurality of capacitors. More specifically, the differential operational amplifier has an inverting input terminal and a non-inverting input terminal. The non-inverting input terminal is electrically connected to the equipment grounding point, and the inverting input terminal is electrically connected to any one of the live wires or the neutral wire at the equipment input terminal. The differential amplifier circuit is used to capture a voltage difference between the equipment grounding point and one of the live wires or the neutral wire, and output a differential voltage. The low-pass filter circuit is electrically connected to the differential amplifier circuit. The low-pass filter circuit is composed of an operational amplifier, a plurality of resistors, and a plurality of capacitors. More specifically, the operational amplifier has an inverting input terminal and a non-inverting input terminal. The non-inverting input terminal is electrically connected to the differential operational amplifier to receive the differential voltage. The operational amplifier is used to capture DC components of the differential voltage, that is, the voltage outputted from the operational amplifier is the DC resistance voltage.

Finally, a DC voltage difference measured between the equipment input terminal and the equipment grounding point is equal to the DC resistance voltage according to the characteristic of the zero DC component in the AC power source so that the grounding resistance between the equipment grounding point and the power grounding point can be accurately calculated by the microprocessor (S40). Accordingly, the DC resistance voltage can be outputted to a microprocessor to accurately calculate the grounding resistance. More specifically, the grounding resistance can be accurately calculated by calculating the DC resistance voltage and the DC resistance current flowing through the grounding resistance, namely, the DC current by the microprocessor.

In addition, the DC voltage detection circuit further includes a gain adjustment circuit, and the gain adjustment circuit is electrically connected between the low-pass filter circuit and the microprocessor. The gain adjustment circuit is composed of an operational amplifier and a plurality of resistors. More specifically, the operational amplifier has an inverting input terminal and a non-inverting input terminal.

The non-inverting input terminal is electrically connected to the operational amplifier to receive the DC resistance voltage. The gain adjustment circuit is used to adjust the DC resistance voltage into an adjusted DC resistance voltage so that the scale of the adjusted DC resistance voltage is suitable for the microprocessor in the signal magnitude and the signal resolution.

In conclusion, the present disclosure has following advantages:

1. The higher adaptivity and robustness can be implemented of the grounding resistance measurement apparatus because the grounding resistance measurement apparatus can be applied to a multi-phase power system;

2. The lower circuit development costs and simpler circuit designs can be achieved because the DC power generation circuit 10 can be designed by using passive electronic components;

3. The DC voltage difference measured between the equipment input terminal Sc and the equipment grounding point PE is equal to the DC resistance voltage $V_{dc\_Rg}$ according to the characteristic of the zero DC component in the AC power source so that the small-scale grounding resistance Rg between the equipment grounding point PE and the power grounding point PEs can be accurately calculated by the microprocessor 30; and 4. The protections of the human body and the electrical equipment can be implemented because the leakage current flowing back to the grounding wire is small.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A grounding resistance measurement apparatus electrically connected between an equipment input terminal providing an AC power source and an equipment grounding point, and configured to measure a grounding resistance at an AC power terminal, the grounding resistance measurement apparatus comprising:
    a DC power generation circuit electrically connected to the equipment input terminal and the equipment grounding point, and configured to receive the AC power source and convert the AC power source into a DC power source; the DC power source configured to produce a DC resistance voltage across the grounding resistance; and
    a DC voltage detection circuit electrically connected to the equipment input terminal and the equipment grounding point, and configured to receive the AC power source which is also received by the DC power generation circuit and measure a DC voltage difference between the equipment input terminal and the equipment grounding point;
    wherein the grounding resistance is calculated because the DC voltage difference is equal to the DC resistance voltage across the grounding resistance according to a characteristic of the zero DC component in an AC power loop.

2. The grounding resistance measurement apparatus in claim 1, wherein the DC power generation circuit comprises:
    at least one diode electrically connected to the equipment input terminal; and
    a resistor electrically connected to the at least one diode.

3. The grounding resistance measurement apparatus in claim 2, wherein a cathode of the at least one diode is electrically connected to one terminal of the resistor; anodes of the diodes are correspondingly electrically connected to the equipment input terminal.

4. The grounding resistance measurement apparatus in claim 2, wherein an anode of the at least one diode is electrically connected to one terminal of the resistor; cathodes of the diodes are correspondingly electrically connected to the equipment input terminal.

5. The grounding resistance measurement apparatus in claim 1, wherein the DC power generation circuit is configured to generate a DC voltage source.

6. The grounding resistance measurement apparatus in claim 5, further comprising:
    a microprocessor configured to receive the DC resistance voltage and calculate the grounding resistance according to the DC voltage source and the DC resistance voltage.

7. The grounding resistance measurement apparatus in claim 1, wherein the DC power generation circuit is configured to generate a DC current source.

8. The grounding resistance measurement apparatus in claim 7, further comprising:
    a microprocessor configured to receive the DC resistance voltage and calculate the grounding resistance according to a ratio of the DC resistance voltage and the DC current source.

9. The grounding resistance measurement apparatus in claim 1, wherein the DC voltage detection circuit comprises:
    a differential amplifier circuit has a differential operational amplifier with two input terminals, a plurality of resistor, and a plurality of capacitors; the two input terminals are correspondingly electrically connected to the equipment grounding point and one of the live wires or the neutral wire at the equipment input terminal to capture a voltage difference between the equipment grounding point and one of the live wires or the neutral wire and output a differential voltage; and
    a low-pass filter circuit has an operational amplifier, a plurality of resistors, and a plurality of capacitors; the low-pass filter circuit is configured to receive the differential voltage and filter the differential voltage to acquire the DC resistance voltage.

10. The grounding resistance measurement apparatus in claim 9, wherein the DC voltage detection circuit further comprises:
    a gain adjustment circuit has an operational amplifier and a plurality of resistors; the gain adjustment circuit is configured to receive the DC resistance voltage and adjust the DC resistance voltage into an adjusted DC resistance voltage.

11. The grounding resistance measurement apparatus in claim 6, wherein the microprocessor is configured to receive the DC resistance voltage according to the varied conditions of the AC power source so that the calculated grounding resistance is unaffected by the varied conditions.

12. The grounding resistance measurement apparatus in claim 8, wherein the microprocessor is configured to receive the DC resistance voltage according to the varied conditions of the AC power source so that the calculated grounding resistance is unaffected by the varied conditions.

13. A method of operating a grounding resistance measurement apparatus electrically connected between an equipment input terminal providing an AC power source and an equipment grounding point, and configured to measure a grounding resistance at an AC power terminal; the method comprising:
- (a) providing a DC power generation circuit electrically connected to the equipment input terminal and the equipment grounding point to receive the AC power source;
- (b) converting the AC power source into a DC power source, and the DC power source is configured to produce a DC resistance voltage across the grounding resistance;
- (c) providing a DC voltage detection circuit to receive the AC power source which is also received by the DC power generation circuit and measure a DC voltage difference between the equipment input terminal and the equipment grounding point; and
- (d) calculating the grounding resistance because the DC voltage difference is equal to the DC resistance voltage across the grounding resistance according to a characteristic of the zero DC component in an AC power loop.

14. The method of operating the grounding resistance measurement apparatus in claim 13, wherein the DC power generation circuit comprises:
at least one diode electrically connected to the equipment input terminal; and
a resistor electrically connected to the at least one diode.

15. The method of operating the grounding resistance measurement apparatus in claim 14, wherein cathodes of the diodes are electrically connected to each other and then connected to one terminal of the resistor; anodes of the diodes are correspondingly electrically connected to the equipment input terminal.

16. The method of operating the grounding resistance measurement apparatus in claim 14, wherein anodes of the diodes are electrically connected to each other and then connected to one terminal of the resistor; cathodes of the diodes are correspondingly electrically connected to the equipment input terminal.

17. The method of operating the grounding resistance measurement apparatus in claim 13, wherein the DC power generation circuit is configured to generate a DC voltage source.

18. The method of operating the grounding resistance measurement apparatus in claim 17, further comprising:
providing a microprocessor to receive the DC resistance voltage and calculate the grounding resistance according to the DC voltage source and the DC resistance voltage.

19. The method of operating the grounding resistance measurement apparatus in claim 13, wherein the DC power generation circuit is configured to generate a DC current source.

20. The method of operating the grounding resistance measurement apparatus in claim 19, further comprising:
providing a microprocessor to receive the DC resistance voltage and calculate the grounding resistance according to a ratio of the DC resistance voltage and the DC current source.

21. The method of operating the grounding resistance measurement apparatus in claim 13, wherein the DC voltage detection circuit comprises:
a differential amplifier circuit has a differential operational amplifier with two input terminals, a plurality of resistor, and a plurality of capacitors; the two input terminals are correspondingly electrically connected to the equipment grounding point and one of the live wires or the neutral wire at the equipment input terminal to capture a voltage difference between the equipment grounding point and one of the live wires or the neutral wire and output a differential voltage; and
a low-pass filter circuit has an operational amplifier, a plurality of resistors, and a plurality of capacitors; the low-pass filter circuit is configured to receive the differential voltage and filter the differential voltage to acquire the DC resistance voltage.

22. The method of operating the grounding resistance measurement apparatus in claim 21, wherein the DC voltage detection circuit further comprises:
a gain adjustment circuit has an operational amplifier and a plurality of resistors; the gain adjustment circuit is configured to receive the DC resistance voltage and adjust the DC resistance voltage into an adjusted DC resistance voltage.

23. The method of operating the grounding resistance measurement apparatus in claim 18, wherein the microprocessor is configured to receive the DC resistance voltage according to the varied conditions of the AC power source so that the calculated grounding resistance is unaffected by the varied conditions.

24. The method of operating the grounding resistance measurement apparatus in claim 20, wherein the microprocessor is configured to receive the DC resistance voltage according to the varied conditions of the AC power source so that the calculated grounding resistance is unaffected by the varied conditions.

* * * * *